(12) United States Patent
Kaneko (10) Patent No.: US 7,440,481 B2
(45) Date of Patent: Oct. 21, 2008

(54) SURFACE-EMITTING TYPE SEMICONDUCTOR LASER AND METHOD FOR MANUFACTURING THE SAME

(75) Inventor: Tsuyoshi Kaneko, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/551,848

(22) Filed: Oct. 23, 2006

(65) Prior Publication Data

US 2007/0096122 A1 May 3, 2007

(30) Foreign Application Priority Data

Nov. 2, 2005 (JP) ............................. 2005-319278

(51) Int. Cl.
*H01S 5/00* (2006.01)

(52) U.S. Cl. ............. 372/43.01; 372/50.11; 372/50.124

(58) Field of Classification Search ............... 372/50.11, 372/50.124, 43.01
See application file for complete search history.

(56) References Cited

U.S. PATENT DOCUMENTS 5,136,345 A  8/1992  Kasahara 5,568,499 A  10/1996  Lear
6,717,972 B2  4/2004  Steinle et al.
2005/0123014 A1 *  6/2005  Shimizu et al. ............... 372/45

FOREIGN PATENT DOCUMENTS

JP  2646799  5/1997
JP  2003-522421  7/2003

* cited by examiner

*Primary Examiner*—Dung T Nguyen
(74) *Attorney, Agent, or Firm*—Harness, Dickey & Pierce, P.L.C.

(57) ABSTRACT

A surface-emitting type semiconductor laser includes: an upper mirror and a lower mirror each composed of alternately formed first semiconductor layers and second semiconductor layers; an active layer disposed between the upper mirror and the lower mirror, wherein the surface-emitting laser emits laser light in a direction in which the first semiconductor layers and the second semiconductor layers are formed; a thick film layer formed with one of the first semiconductor layers composing the lower mirror, the thick film layer being thicker than other of the first semiconductor layers; and a third semiconductor layer provided between the thick film layer and one of the second semiconductor layers on the thick film layer, the third semiconductor layer having a refractive index between a refractive index of the first conductive layer and a refractive index of the second semiconductor layer.

10 Claims, 5 Drawing Sheets

SURFACE-EMITTING TYPE SEMICONDUCTOR LASER AND METHOD FOR MANUFACTURING THE SAME

The entire disclosure of Japanese Patent Application No.2005-319278, filed Nov. 2, 2005 is expressly incorporated by reference herein.

BACKGROUND

1. Technical Field

The present invention relates to surface-emitting type semiconductor lasers that emit laser light and methods for manufacturing the same.

2. Related Art

A surface-emitting type semiconductor laser is provided with a resonator formed in a direction orthogonal to a substrate surface, and emits laser light from the substrate surface. Compared to edge-emitting type semiconductor lasers that use parallel cleavage planes of a substrate as a resonator, surface-emitting type semiconductor lasers have various favorable characteristics. For example, surface-emitting type semiconductor lasers are suitable for mass-production, capable of direct modulation, and capable of operation with low threshold current, and a two-dimensional laser array structure can be readily formed with surface-emitting type semiconductor lasers.

A basic structure of a surface-emitting type semiconductor laser includes a lower mirror composed of a semiconductor multilayer film, an active layer and an upper mirror composed of a semiconductor multilayer film sequentially formed on a substrate. The lower mirror and the upper mirror form a resonator, and the active layer is disposed within the resonator. As the upper mirror and the lower mirror provided in the surface-emitting type semiconductor laser, distributed Bragg reflection mirrors (or DBR: Distributed Bragg Reflector) each composed of alternately formed two kinds of semiconductor layers of different refractive indexes are often used. When a DBR is formed with an AlGaAs group material, two kinds of semiconductor layers having different aluminum (Al) and gallium (Ga) compositions are used.

As described above, a surface-emitting type semiconductor laser has a structure in which an active layer is disposed within a resonator that is composed of an upper mirror and a lower mirror. Therefore, a current needs to be supplied to the active layer through DBRs. The DBR has a high resistance because of energy barriers at interfaces of the different kinds of formed semiconductor layers composing the DBR. Japanese Patent 2646799 describes a technology to reduce the resistance of a DBR by forming, between semiconductor layers composing the DBR, a composition graded layer (or graded index (GI) layer) whose composition is gradually changed.

Also, the surface-emitting type semiconductor laser has a current constricting layer formed near the active layer for controlling the current path of a current flowing through the active layer, and therefore is often formed into a mesa structure for forming the current constricting layer. In other words, the surface-emitting type semiconductor laser is often formed into a structure in a columnar configuration by etching the upper mirror, the active layer, and the lower mirror to an intermediate point thereof. An example of such a surface-emitting type semiconductor laser in a mesa structure is described in Japanese Laid-open Patent Application JP-A-2003-522421.

It is noted that, in the surface-emitting type semiconductor laser having a mesa structure described above, one of electrodes is formed on the upper mirror, and the other electrode is formed on the lower mirror that is exposed by etching. As a result, a current can be supplied to the active layer from an intermediate point of the lower mirror, and therefore the resistance can be reduced, compared to the case where a current is supplied to the active layer through the entire thickness of the lower mirror. The electrode formed on the lower mirror that is exposed by etching needs to have ohmic contact with the lower mirror.

The electrode may need to be formed on a lower composition layer with a smaller aluminum (Al) composition among the layers composing the above-described DBR that is formed with an AlGaAs group material, because it is difficult to have ohmic contact with a higher composition layer with a higher aluminum (Al) composition. For this reason, when the lower mirror is etched, a lower composition layer needs to be exposed. Etching of the upper mirror, the active layer, and the lower mirror to an intermediate point thereof are often conducted by dry etching. If a lower composition layer can be exposed by etching the lower mirror by dry etching, there would be no problem in forming the electrode.

On the other hand, if a higher composition layer is exposed by dry etching, the higher composition layer needs to be removed by wet etching with an etchant, such as, for example, hydrofluoric acid (HF), to thereby expose a lower composition layer. However, when a GI layer described above is formed in the lower mirror, and a higher composition layer is exposed at the surface by dry etching, if a lower composition layer is exposed by etching, a GI layer on the lower composition layer (wherein the GI layer has a greater aluminum (Al) composition than the aluminum (Al) composition of the lower composition layer) would remain without being etched. If an electrode is formed on the GI layer, sufficient ohmic contact cannot be obtained, which leads to a problem of higher resistance. Also, because the electrode formed on the GI layer has poor adhesion with the GI layer, there is a possibility that the electrode may be peeled off during the mounting process, and the yield may be lowered.

SUMMARY

In accordance with an advantage of some aspects of the present invention, it is possible to provide a surface-emitting type semiconductor laser in which low resistance and sufficient ohmic contact can be achieved, and a method for manufacturing a surface-emitting type semiconductor laser that can manufacture the surface-emitting type semiconductor laser without lowering the yield.

A surface-emitting type semiconductor laser in accordance with an embodiment of the invention includes an upper mirror and a lower mirror each composed of alternately formed first semiconductor layers and second semiconductor layers, and an active layer disposed between the upper mirror and the lower mirror, wherein the surface-emitting laser emits laser light in a direction in which the first semiconductor layers and the second semiconductor layers are formed, wherein one of the first semiconductor layers composing the lower mirror is a thick film layer thicker than the other of the first semiconductor layers, and a third semiconductor layer having a refractive index between a refractive index of the first conductive layers and a refractive index of the second semiconductor layers is provided between the thick film layer and one of the second semiconductor layers on the thick film layer.

According to the present embodiment, one of the semiconductor layers of the lower mirror formed below the active layer is formed to be a thick film layer, and a third semiconductor layer having a refractive index between a refractive index of the first conductive layers and a refractive index of the second semiconductor layers is provided between the thick film layer and the second semiconductor layer on the thick film layer, such that the resistance can be lowered. Further, because the third semiconductor layer is formed on the thick film layer, the third semiconductor layer can be sufficiently removed and the thick film layer can be exposed even when the amount of etching varies. Accordingly, when an electrode is formed on the thick film layer, good ohmic contact between the two can be obtained, and the adhesion of the electrode can be increased.

In the surface-emitting type semiconductor laser in accordance with an aspect of the embodiment of the invention, the third semiconductor layer may also be provided in at least one of pairs of alternately formed first semiconductor layers and second semiconductor layers located above the thick film layer.

According to the embodiment of the invention, the resistance can be further reduced because the third semiconductor layers may be also formed between the first semiconductor layers and the second semiconductor layers located above the thick film layer.

In the surface-emitting type semiconductor laser in accordance with an aspect of the embodiment of the invention, the second semiconductor layer may be provided under the thick film layer without the third semiconductor layer being intervened between them.

According to this aspect of the present embodiment, because the second semiconductor layer under the thick film layer may be provided without the third semiconductor layer being disposed between them, the mirror located below the active layer can be formed into a mirror with excellent optical characteristics which uses a sharp change in refractive index between the thick film layer (first semiconductor layer) and the second semiconductor layer.

Furthermore, in the surface-emitting type semiconductor laser in accordance with an aspect of the embodiment of the invention, the first semiconductor layers and the second semiconductor layers located below the thick film layer may be formed without the third semiconductor layers being intervened.

According to this aspect of the present embodiment, the first semiconductor layers and the second semiconductor layers located below the thick film layer are formed without the third semiconductor layers being intervened, such that the mirror located below the active layer can be formed into a mirror with excellent optical characteristics which uses a sharp change in refractive index between the first semiconductor layers and the second semiconductor layers. Also, because a current supplied to the active layer does not flow through the first semiconductor layers and the second semiconductor layers located below the thick film layer, the resistance does not increase.

Also, in the surface-emitting type semiconductor laser in accordance with an aspect of the embodiment of the invention, the upper mirror, the active layer and a portion of the lower mirror above the thick film layer may be formed into a columnar section in a columnar configuration.

In accordance with an aspect of the embodiment of the invention, the thick film layer may be formed into a columnar configuration having an upper portion with a plane configuration identical with a plane configuration of the columnar section.

In the surface-emitting type semiconductor laser in accordance with an aspect of the embodiment of the invention, the thick film layer located at least below the columnar section may have an optical film thickness of $3\lambda/4$ or greater and an odd multiple of $\lambda/4$, where $\lambda$ is a wavelength of the laser light.

According to this aspect of the embodiment, the optical film thickness of the thick film layer located at least below the columnar section is set to $3\lambda/4$ or greater and an odd multiple of $\lambda/4$, and therefore the optical characteristics of the mirror located below the active layer would not be lowered.

In the surface-emitting type semiconductor laser in accordance with an aspect of the embodiment of the invention, one of electrodes that supply a current to the active layer may be provided on the thick film layer.

According to this aspect of the embodiment, the electrode is formed on the thick film layer, and a current can be supplied to the active layer from an intermediate point of the mirror located below the active layer, which is desirable in view of lowering the resistance. Also, by forming the electrode on the thick film layer, sufficient ohmic contact can be obtained between them, and a high level of adhesion of the electrode can be obtained.

In the surface-emitting type semiconductor laser in accordance with an aspect of the embodiment of the invention, the first semiconductor layer in one of the first pair formed at the uppermost layer of the lower mirror through the fifth pair of alternately formed first semiconductor layers and second semiconductor layers may be formed to be the thick film layer.

According to this aspect of the embodiment of the invention, the first semiconductor layer in the first through fifth pairs of the first semiconductor layers and second semiconductor layers formed in an uppermost layer portion of the lower mirror located below the active layer is formed to be the thick film layer. It is desirous to form the thick film layer at a position close to the active layer as much as possible in view of reducing the resistance. However, when a portion above the thick film layer is formed into a columnar configuration, a stress may be generated at a base section of the columnar section, and cracks may occur in the base section; and if the active layer is disposed at the base section, the characteristics of the element may be deteriorated. In accordance with the present embodiment, since the first semiconductor layer in one of the first pair formed at the uppermost layer of the mirror through the fifth pair of alternately formed first semiconductor layers and second semiconductor layers located below the active layer is formed to be the thick film layer, the resistance can be lowered and the deterioration described above can be prevented.

Also, in the surface-emitting type semiconductor laser in accordance with an aspect of the embodiment of the invention, the first semiconductor layer and the second semiconductor layer are composed of mixed crystal semiconductors of mutually different compositions.

Furthermore, in the surface-emitting type semiconductor laser in accordance with an aspect of the embodiment of the invention, the first semiconductor layer is composed of mixed crystal semiconductor of a lower composition than that of the second semiconductor layer.

In accordance with another embodiment of the invention, a method for manufacturing a surface-emitting type semiconductor laser including an upper mirror and a lower mirror each composed of alternately formed first semiconductor layers and second semiconductor layers, and an active layer disposed between the upper mirror and the lower mirror, wherein the surface-emitting laser emits laser light in a direction in which the first semiconductor layers and the second semiconductor layers are formed, the method including the steps of: forming one of the first semiconductor layers composing the lower mirror into a thick film layer thicker than the other of the first semiconductor layers when the lower mirror is formed; forming a third semiconductor layer having a refractive index between a refractive index of the first conductive layers and a refractive index of the second semiconductor layers on the thick film layer; forming a portion of the upper mirror, the active layer and the lower mirror on the thick film layer into a columnar section in a columnar configuration by etching the upper mirror, the active layer and the lower mirror to the thick film layer formed in the lower mirror.

According to the present embodiment, when the lower mirror that is located below the active layer is formed, one of the first semiconductor layers composing the lower mirror is formed to be a thick film layer, and a third semiconductor layer having a refractive index between a refractive index of the first conductive layers and a refractive index of the second semiconductor layers is formed on the thick film layer, such that the resistance can be lowered.

In the method for manufacturing a surface-emitting type semiconductor laser in accordance with an aspect of the embodiment of the invention, the step of forming the columnar section may include over-etching an upper portion of the thick film layer.

According to this aspect of the embodiment, the upper portion of the thick film layer is over-etched, such that the third semiconductor layer on the thick film layer can be sufficiently removed and the thick film layer can be exposed even when the amount of etching varies. Therefore, when an electrode is formed on the thick film layer, good ohmic contact between the two can be obtained, and the adhesion of the electrode can be increased. Accordingly, surface-emitting type semiconductor lasers can be manufactured with a high yield without exfoliation of electrodes occurring during the mounting process.

Also, in the method for manufacturing a surface-emitting type semiconductor laser in accordance with an aspect of the embodiment of the invention, the first semiconductor layer and the second semiconductor layer may be composed of mixed crystal semiconductors of mutually different compositions, and the amount of etching is controlled while monitoring changes in the compositions, when the first mirror, the active layer and the lower mirror are etched to the thick film layer formed in the lower mirror.

According to this aspect of the embodiment, when the upper mirror, the active layer and the lower mirror are etched to the thick film layer, the amount of etching is controlled while monitoring changes in the compositions, such that the third semiconductor layer on the thick film layer can be sufficiently removed and the thick film layer can be exposed.

Also, in the method for manufacturing a surface-emitting type semiconductor laser in accordance with an aspect of the embodiment of the invention, the step of etching the upper mirror, the active layer and the lower layer to the thick film layer may preferably be conducted by using a dry etching method.

DESCRIPTION OF EXEMPLARY EMBODIMENTS

A surface-emitting type semiconductor laser and its manufacturing method in accordance with an embodiment of the invention are described in detail with reference to the accompanying drawings. It is noted that the embodiment to be described below indicates a part of modes of the invention, does not limit the invention, and can be appropriately modified within the scope of the invention. Also, in the drawings referred to below for describing the invention, the scale may be changed for each of the layers and each of the members such that the layers and the members can have appropriate sizes that can be recognized on the drawings.

Surface-Emitting Type Semiconductor Laser

Figure 1:
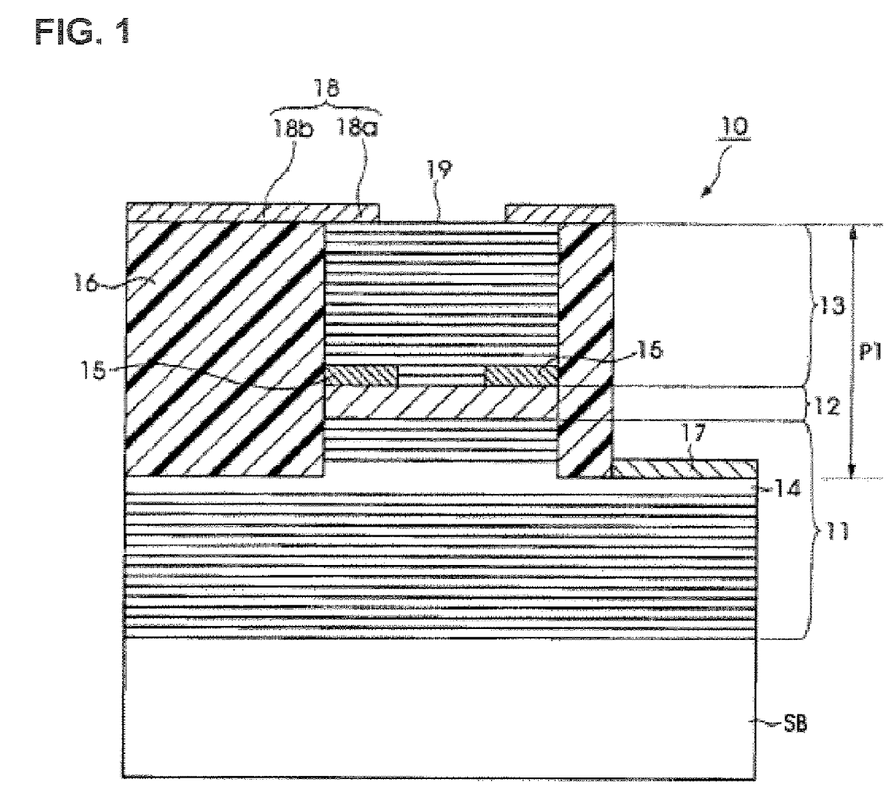
FIG. 1 is a schematic cross-sectional view of a surface-emitting type semiconductor laser in accordance with an embodiment of the invention.

FIG. 1 is a schematic cross-sectional view of a surface-emitting type semiconductor laser 10 in accordance with an embodiment of the invention. As shown in FIG. 1, the surface-emitting type semiconductor laser 10 is formed on a semiconductor substrate (e.g., an n-type GaAs substrate in the present embodiment) SB. The surface-emitting type semiconductor laser 10 includes a vertical resonator. In accordance with the present embodiment, one of distributed reflection type multilayer mirrors (second mirror) 13, an active layer 12 and a portion of the other distributed reflection type multilayer mirror (first mirror) 11 that form the vertical resonator are formed in a columnar semiconductor deposited body (hereafter referred to as a columnar section) P1. In other words, the surface-emitting type semiconductor laser 10 has a structure in which a part thereof is included in the columnar section P1.

The surface-emitting type semiconductor laser 10 has a structure in which the aforementioned first mirror 11, the active layer 12 and the third mirror 13 are sequentially formed on the semiconductor substrate SB. The first mirror 11 and the second mirror 13 are distributed reflection type multilayer mirrors each composed of alternately formed three-element mixed crystal semiconductors of mutually different compositions. The first mirror is, for example, a distributed reflection type multilayer mirror of 40 pairs of alternately formed n-type $Al_{0.15}Ga_{0.85}As$ layers (hereafter referred to as "lower composition layers") and n-type $Al_{0.9}Ga_{0.1}As$ layers (hereafter referred to as "higher composition layers"). One of the lower composition layers composing the first mirror 11 is formed in a columnar configuration having a top portion thereof with the same plane configuration as that of the columnar section P1, and formed into a thick film layer 14 having a thickness greater than the thickness of the other of the lower composition layers in at least a portion located below the columnar section P1.

It is noted that, in the present embodiment, the lower composition layer means an AlGaAs layer with an aluminum (Al) composition being lower than a gallium (Ga) composition, and the higher composition layer means an AlGaAs layer with an aluminum (Al) composition being higher than a gallium (Ga) composition. The Al composition in an AlGaAs layer ranges from 0 to 1. In other words, an AlGaAs layer includes a GaAs layer (when the Al composition is 0) and an AlAs layer (when the Al composition is 1). Also, the composition of each of the layers and the number of the layers forming the first mirror 11, the active layer 12 and the second mirror 13 are not particularly limited to the above. It is noted that the Al composition of the topmost layer of the second mirror 13 may preferably be less than 0.3.

Figure 2:
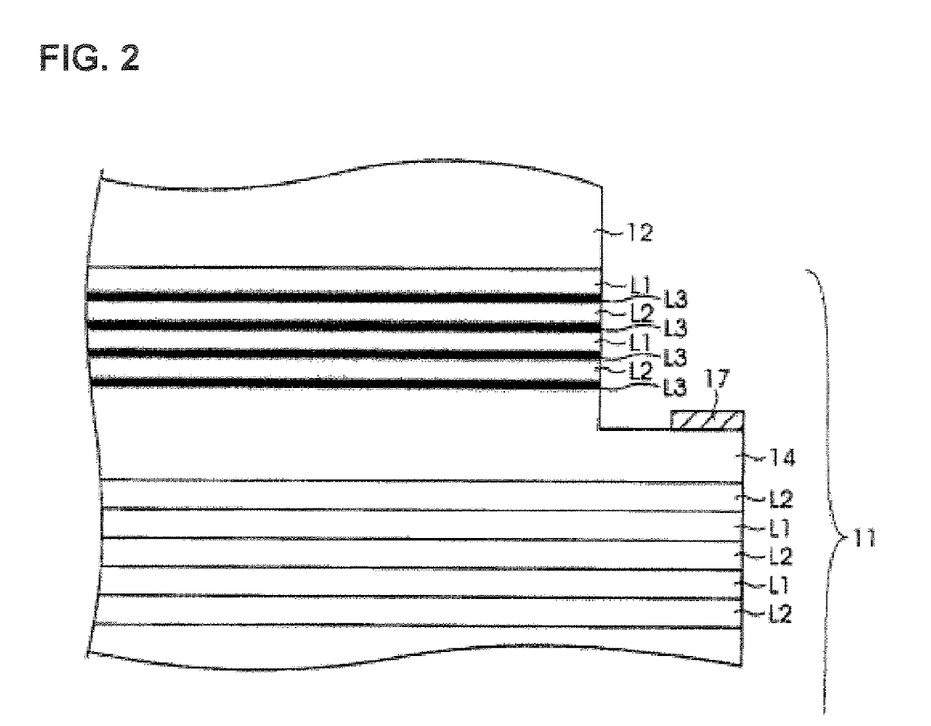
FIG. 2 is an enlarged cross-sectional view of a first mirror 11.

FIG. 2 is an enlarged cross-sectional view of the first mirror 11. As shown in FIG. 2, the first mirror 11 is composed of alternately formed lower composition layers L1 and higher composition layers L2, wherein one of the lower composition layers L1 is formed to be the thick film layer 14. Each of the higher composition layers L1 and the lower composition layers L2 is set to have an optical film thickness of $\lambda/4$. It is noted that $\lambda$ is a wavelength of laser light of the surface-emitting type semiconductor laser 10. The thick film layer 14 is set, in at least a portion thereof located below the columnar section P1, to have an optical film thickness of $3\lambda/4$ or greater, and an odd multiple of $\lambda/4$. This is because the thick film layer 14 also composes a portion of the first mirror 11, and therefore the film thickness of the thick film layer 14 also needs to be set such that the first mirror 11 has a high refractive index.

Also, as shown in FIG. 2, between the thick film layer 14 and one of the higher composition layers L2 on the thick film layer 14 composing the first mirror 11, and between the lower composition layers L1 and the higher composition layers L2 located above the thick film layer 14, graded index layers (hereafter referred to as GI layers) L3, in which the Al composition is gradually changed, are formed, respectively. The GI layer L3 is a layer whose Al composition is gradually changed between 0.15 and 0.9, such that the energy barrier at an interface between the thick film layer 14 and the higher composition layer L2 and at an interface between the lower composition layer L1 and the higher composition layer L2 is smoothed to thereby reduce the resistance. It is noted that, because a change in the Al composition causes a change in the refractive index, the refractive index gradually changes in a portion where the GI layer L3 is formed.

In contrast, GI layers are not formed between the thick film layer 14 and one of the higher composition layers L2 immediately under the thick film layer 14 composing the first mirror 11, and between the lower composition layers L1 and the higher composition layers L2 located blow the thick film layer 14. In other words, the higher composition layers L2 is provided under the thick film layer 14 without a GI layer being intervened, and the lower composition layers L1 and the higher composition layers L2 located below the thick film layer 14 are formed without GI layers being intervened. As shown in FIG. 1, electrodes for driving the surface-emitting type semiconductor laser 10 are provided on the thick film layer 14 of the first mirror 11 and on the second mirror 13, and therefore a current does not flow blow the thick film layer 14.

The GI layer is provided to reduce the resistance of the first mirror 11, and the refractive index also gradually changes, as described above. To provide the first mirror 11 with a high refractive index, it is desirous that the refractive index sharply changes between the lower composition layer L1 and the higher composition layer L2. For this reason, the first mirror 11 is provided with a structure in which GI layers are not provided between the thick film layer 14 and the adjacent higher composition layer L2 therebelow and between the lower composition layers L1 and the higher composition layers L2 located below the thick film layer 14 where no current flows, whereby the refractive index of the first mirror 11 is made higher.

Also, the thick film layer 14 may preferably be formed in one of the first pair formed in the uppermost layer of the first mirror 11 through the fifth pair therebelow. It is desirous to form the thick film layer 14 at a position close to the active layer 12 as much as possible in view of reducing the resistance of the surface-emitting type semiconductor laser 10. However, as described above, the surface-emitting type semiconductor laser 10 in accordance with the present embodiment has a structure in which a portion thereof is included in the columnar section P1, and therefore stress would likely be concentrated at the base section of the columnar section P1, and the base section would likely be deteriorated.

As shown in FIG. 1, the thick film layer 14 is disposed at the base section of the columnar section P1, and characteristics of the surface-emitting type semiconductor laser 10 would likely be deteriorated when the thick film layer 14 and the active layer 12 are too close to each other. In reverse, when the thick film layer 14 is formed at a location too far away from the active layer 12, the resistance would become higher although the GI layers L3 described above are formed. Therefore, by forming the thick film layer 14 in one of the first pair formed in the uppermost layer of the first mirror 11 through the fifth pair therebelow, the resistance can be lowered and the above-mentioned deterioration can be prevented.

The active layer 12 is formed on the first mirror 11, and is composed of GaAs well layers and $Al_{0.3}Ga_{0.7}As$ barrier layers in which the well layers include a quantum well structure composed of three layers. The second mirror 13 is formed on the active layer 12, and is a distributed reflection type multi-layer mirror of 25 pairs of alternately formed p-type $Al_{0.15}Ga_{0.85}As$ layers (hereafter referred to as lower composition layers) and p-type $Al_{0.9}Ga_{0.1}As$ layers (hereafter referred to as higher composition layers). It is noted that the second mirror 13 at the topmost layer is formed to be a layer with a smaller Al composition, in other words, a p-type $Al_{0.15}Ga_{0.85}As$ layer. Between the lower composition layers and the higher composition layers forming the second mirror 13, graded index (GI) layers whose Al composition is gradually changed are formed.

The first mirror 11 composing the surface-emitting type semiconductor laser 10 is formed to be n-type by, for example, doping silicon (Si), and the second mirror 13 is formed to be p-type by, for example, doping carbon (C). Accordingly, the p-type second mirror 13, the active layer 12 in which no impurity is doped, and the n-type first mirror 11 form a pin diode.

A portion among the surface-emitting type semiconductor laser 10 extending from the second mirror 13 to an intermediate point of the thick film layer 14 of the first mirror 11 is etched in a circular shape, as viewed from an upper surface of the second mirror 13, thereby forming a columnar section P1. It is noted that the present embodiment is described as to a case in which the columnar section P1 has a plane configuration that is circular, but its configuration can have any other arbitrary configurations.

Furthermore, a current constricting layer 15, which is obtained by oxidizing the AlGaAs layer from its side surface, is formed in a region near the active layer 12 among the layers composing the second mirror 13. The current constricting layer 15 is formed in a ring shape. In other words, the current constricting layer 15 has a cross section, when cut in a plane parallel with a surface of the semiconductor substrate SB, which is a circular ring shape concentric with a circular shape of the plane configuration of the columnar section P1.

In the surface-emitting type semiconductor laser 10 of the present embodiment, an insulation layer 16 is provided on the first mirror 11 in a manner to surround the circumference of the columnar section P1. By surrounding the circumference of the columnar section P1 with the insulation layer 16, oxidation of the layers composing the columnar section P1 can be prevented, such that the reliability of the surface-emitting type semiconductor laser 10 can be improved. The insulation layer 16 may have a film thickness of, for example, about 2-4 μm, and can be formed from material that is obtained by hardening liquid material settable by energy, such as, heat, light or the like (for example, a precursor of ultraviolet setting type resin or thermosetting type resin). As the ultraviolet setting type resin, for example, an ultraviolet setting type acrylic resin, epoxy resin or the like can be enumerated. Also, as the thermosetting type resin, a thermosetting type polyimide resin or the like can be enumerated.

An electrode 17 is formed on the first mirror 11 (on the thick film layer 14), and an electrode 18 is formed on the second mirror 13. The electrode 17 is bonded on and electrically connected to an upper surface (the thick film layer 14) of the first mirror 11. It is noted that the electrode 17 is connected to a pad section (not shown). For example, the electrode 18 has a connecting section 18a having a ring-shaped plane configuration that defines an opening at a central portion of the second mirror 13, and a lead-out section 18b that connects the connecting section 18a to a pad section (not shown) (which is different from the aforementioned pad section connected to the electrode 17). It is noted that the upper surface of the second mirror 13 defines an emission surface 19 of laser light. The lead-out section 18b is formed on the insulation layer 16 and extends to the pad section (not shown).

The electrode 17 is composed of, for example, a formed film of an alloy of gold (Au) and germanium (Ge), and gold (Au), and is in ohmic contact with the thick film layer 14 of the first mirror 11. Also, the electrode 18 is composed of, for example, a formed film of platinum (Pt), titanium (Ti) and gold (Au), and is in ohmic contact with the upper surface of the second mirror 13. These electrodes 17 and 18 are used to drive the surface-emitting type semiconductor laser 10, and an electric current is injected in the active layer 12 by the electrode 17 and the electrode 18. It is noted that the materials for forming the electrode 17 and the electrode 18 are not limited to those described above, and, for example, an alloy of gold (Au) and zinc (Zn) can be used.

General operations of the surface-emitting type semiconductor laser 10 of the present embodiment are described below. It is noted that the following method for driving the surface-emitting type semiconductor laser 10 is described as an example, and various changes can be made within the scope of the invention. First, when a voltage in a forward direction is applied to the pin diode across the electrode 17 and the electrode 18 that are connected to a power supply (not shown), holes flow in the active layer 12 from the electrode 18 through the second mirror 13, and electrons flow in the active layer 12 from the electrode 17 through the thick film layer 14 and an upper portion of the first mirror 11. Recombination of electrons and holes occur in the active layer 12 of the surface-emitting type semiconductor laser 10, thereby causing emission of light due to the recombination. Stimulated emission occurs during the period the generated light reciprocates between the second mirror 13 and the first mirror 11, whereby the light intensity is amplified. When the optical gain exceeds the optical loss, laser oscillation occurs, whereby laser light is emitted from the upper surface (the emission surface 19) of the second mirror 13.

Method for Manufacturing Surface-Emitting Type Semiconductor Laser

Figure 3A:
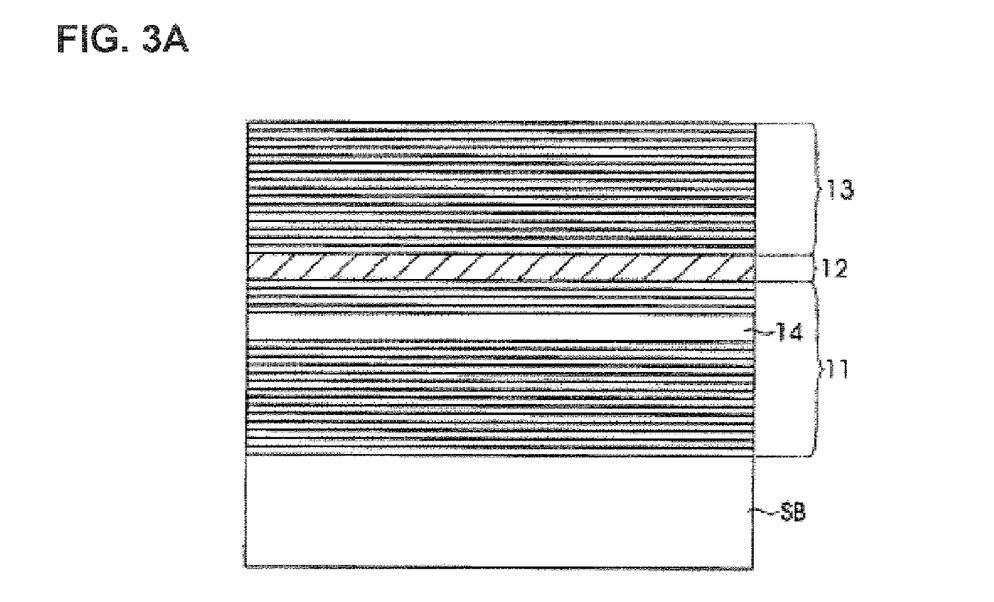
FIGS. 3A and 3B are cross-sectional views schematically showing steps of a method for manufacturing a surface-emitting type semiconductor laser in accordance with an embodiment of the invention.

Next, a method for manufacturing the surface-emitting type semiconductor laser 10 described above is described. FIGS. 3-5 are cross-sectional views schematically showing a process of manufacturing the surface-emitting type semiconductor laser in accordance with an embodiment of the invention. It is noted that these drawings correspond to the cross-sectional view shown in FIG. 1, respectively. To manufacture the surface-emitting type semiconductor laser 10 of the present embodiment, first, as shown in FIG. 3A, on a semiconductor substrate SB composed of an n-type GaAs layer, a semiconductor multilayered film is formed by epitaxial growth while modifying their composition.

The semiconductor multilayered film is composed of a first mirror 11, an active layer 12 and a second mirror 13. The first mirror 11 may be formed by alternately forming n-type $Al_{0.15}Ga_{0.85}As$ layers (lower composition layers L1) and n-type $Al_{0.9}Ga_{0.1}As$ layers (higher composition layers L2) in about 35 pairs. The lower composition layers L1 and the higher composition layers L2 are each formed to have an optical film thickness of $\lambda/4$. Next, a thick film layer 14 is formed on the formed lower composition layers L1 and higher composition layers L2. The thick film layer 14 is formed to have an optical film thickness of $3\lambda/4$ or greater, and an odd multiple of $\lambda/4$. Then, a GI layer L3 (see FIG. 2) is formed on the thick film layer 14, and then higher composition layers L2 and the lower composition layers L1 are alternately formed in about 5 pairs. The lower composition layers L1 and the higher composition layers L2 are also each formed to have an optical film thickness of $\lambda/4$. It is noted that GI layers L3 are formed between the higher composition layers L2 and the lower composition layers L1 above the thick film layer 14.

The active layer 12 is composed of, for example, GaAs well layers and $Al_{0.3}Ga_{0.7}As$ barrier layers in which the well layers include a quantum well structure composed of three layers. The second mirror 13 is formed by alternately forming p-type $Al_{0.15}Ga_{0.85}As$ layers (lower composition layers) and p-type $Al_{0.9}Ga_{0.1}As$ layers (higher composition layers) in about 25 pairs. The lower composition layers and the higher composition layers forming the second mirror 13 are also each formed to have an optical film thickness of $\lambda/4$. Also, GI layers similar to the GI layers L3 described above may be formed between the lower composition layers and the higher composition layers forming the second mirror 13. The uppermost layer of the second mirror 13 is a lower composition layer.

It is noted that, when the second mirror 13 is grown, at least one layer thereof near the active layer 12 is formed to be a layer that is later oxidized and becomes a current constricting layer 15 (see FIG. 4A). For this reason, the layer that becomes to be the current constricting layer 15 is formed to be an AlGaAs layer (including an AlAs layer) having a greater Al composition. For example, the layer that becomes to be the current constricting layer 15 may preferably be formed such that its Al composition becomes to be 0.95 or greater.

Also, when an electrode 18 is formed in a later step, at least a portion of the second mirror 13 near an area contacting the electrode 18 may preferably be formed with a high carrier density such that ohmic contact can be readily made with the electrode 18. Similarly, at least a portion of the thick film layer 14 near an area contacting the electrode 17 may preferably be formed with a high carrier density such that ohmic contact can be readily made with the electrode 17.

The temperature at which the epitaxial growth is conducted is appropriately decided depending on the growth method, the kind of raw material, the type of the semiconductor substrate SB, and the kind, thickness and carrier density of the semiconductor multilayer film to be formed, and may preferably be set generally at 450° C.-800° C. Also, the time required for conducting the epitaxial growth is appropriately decided like the temperature. Also, a metal-organic vapor phase deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 3B:
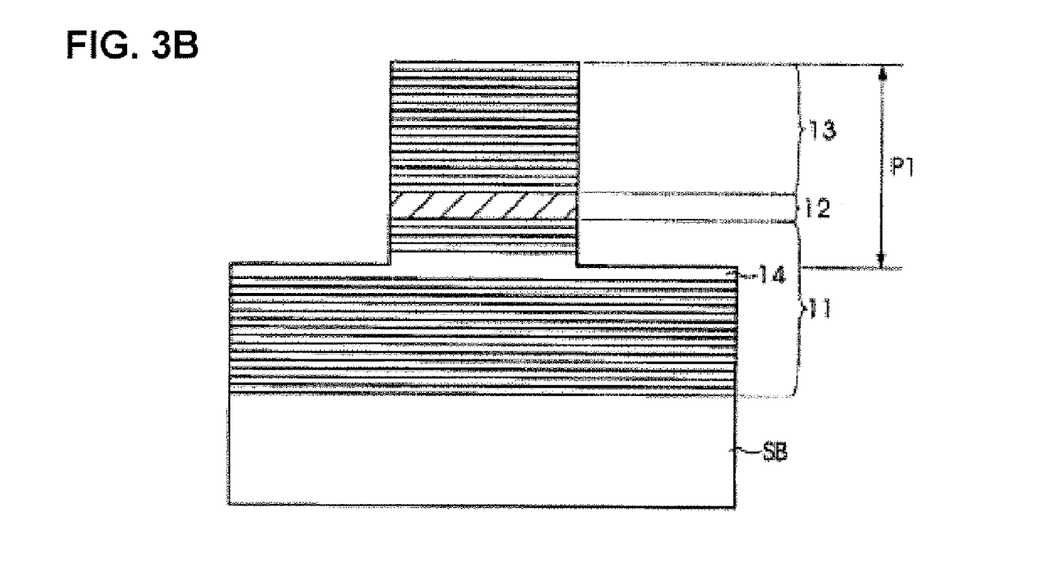

Next, as shown in FIG. 3B, a columnar section P1 is formed. To form the columnar section P1, first, resist (not shown) is coated on the semiconductor multilayer film, and then the resist is patterned by a lithography method. As a result, a resist layer having a specified plane configuration is formed on the upper surface of the second mirror 13. Then, by using the resist layer as a mask, the second mirror 13, the active layer 12 and the first mirror 11 to an intermediate point in the thick film layer 14 are etched by, for example, a dry etching method.

While etching is conducted by a dry etching method, the intensity of emission spectra caused by at least one of aluminum (Al) and gallium (Ga) contained in the plasma is monitored. Then, the amount of etching is controlled based on the monitored result. In particular, in accordance with the present embodiment, the thick film layer 14 is formed within the first mirror 11, and the thick film layer 14 is etched to its intermediate point (over-etched). As described above, the GI layer L3 is formed over the thick film layer 14, and therefore it is desirous to control the amount of etching by referring to the monitored result so that the GI layer L3 on the thick film layer 14 is completely removed. By this, the second mirror 13, the active layer 12 and an upper portion of the first mirror 11 are formed in the same plane configuration into a columnar section P1. It is noted that, when the columnar section P1 is formed, the resist layer is removed.

Figure 4A:
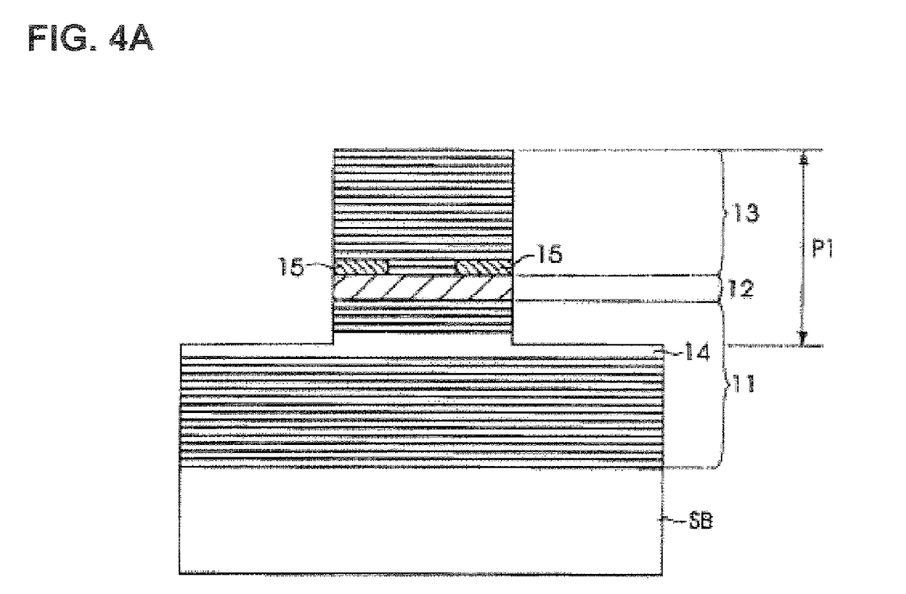
FIGS. 4A and 4B are cross-sectional views schematically showing steps of the method for manufacturing a surface-emitting type semiconductor laser in accordance with an embodiment of the invention.

When the columnar section P1, a current constricting layer 15 is formed, as shown in FIG. 4A. To form the current constricting layer 15, the semiconductor substrate SB on which the columnar section P1 is formed through the aforementioned steps is placed in a water vapor atmosphere at, for example, about 400° C. As a result, a layer having a high Al composition provided in the second mirror 13 described above is oxidized from its side surface, whereby the current constricting layer 15 is formed.

The oxidation rate depends on the temperature of the furnace, the amount of water vapor supply, and the Al composition and the film thickness of the layer to be oxidized. In a surface-emitting type laser equipped with the current constricting layer 15 that is formed by oxidation, current flows only in a portion where the current constricting layer 15 is not formed (a portion that is not oxidized). Accordingly, in the process of forming the current constricting layer 15, the range of the current constricting layer 15 to be formed may be controlled, whereby the current density can be controlled.

Figure 4B:
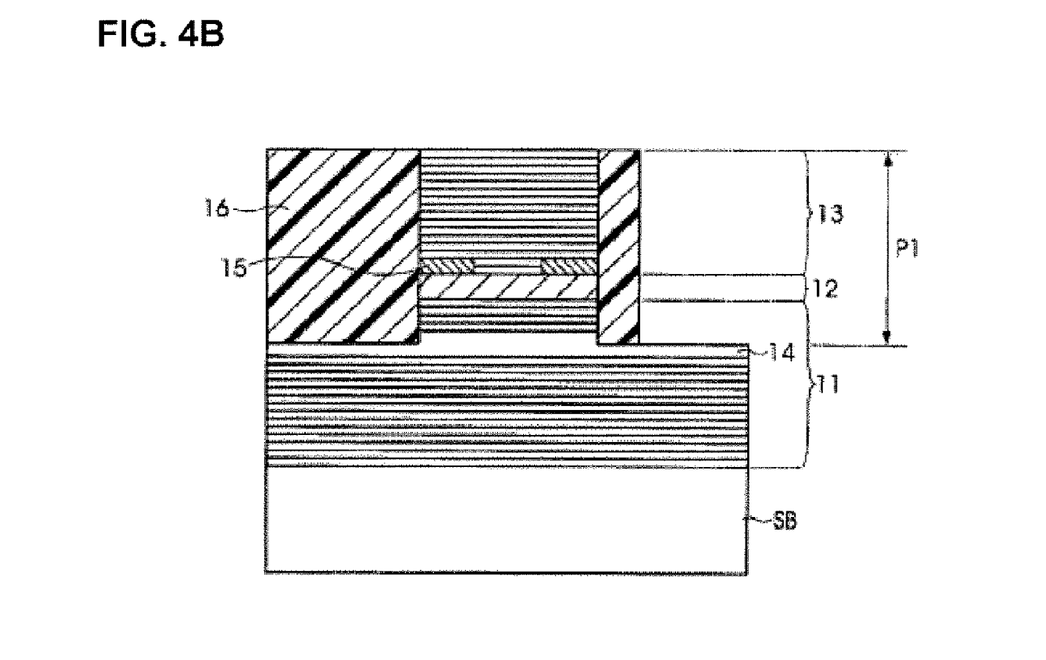

Next, as shown in FIG. 4B, an insulation layer 16 is formed on the first mirror 11 (on the thick film layer 14), around the columnar section P1. The insulation layer 16 may preferably be composed of a material that is easier to make a thick film. The film thickness of the insulation layer 16 may be, for example, about 2-4 μm, but it is not particularly limited. For example, the insulation layer 16 can be formed from material that is obtained by hardening liquid material settable by energy, such as, heat, light or the like (for example, a precursor of ultraviolet setting type resin or thermosetting type resin). As the ultraviolet setting type resin, for example, an ultraviolet setting type acrylic resin, epoxy resin or the like can be enumerated. Also, as the thermosetting type resin, a thermosetting type polyimide resin or the like can be enumerated. Furthermore, for example, the insulation layer 16 may be composed of a formed layered film using a plurality of the materials described above.

In this embodiment, the case where a precursor of polyimide resin is used as the material for forming the insulation layer 16 is described. First, for example, by using a spin coat method, the precursor (precursor of polyimide resin) is coated on the first mirror 11 (on the thick film layer 14), thereby forming a precursor layer. It is noted that, as the method for forming the precursor layer, besides the aforementioned spin coat method, another known technique, such as, a dipping method, a spray coat method, a liquid ink jet method or the like can be used. Then, the semiconductor substrate SB is heated by using, for example, a hot plate or the like, thereby removing the solvent, and then is placed in a furnace at about 350° C. to thereby imidize the precursor layer, whereby a polyimide resin layer that is almost completely set is formed. Then, the polyimide resin layer is patterned by using a known lithography technique, thereby forming the insulation layer 16.

As the etching method used for patterning, a dry etching method or the like can be used. Dry etching can be conducted with, for example, oxygen or argon plasma. In the method for forming the insulation layer 16 described above, an example in which a precursor layer of polyimide resin is hardened and then patterning is conducted is described. However, before hardening the precursor layer of polyimide resin, patterning may be conducted. As the etching method used for this patterning, a wet etching method or the like may be used. The wet etching may be conducted with, for example, an alkaline solution or an organic solution.

Figure 5:
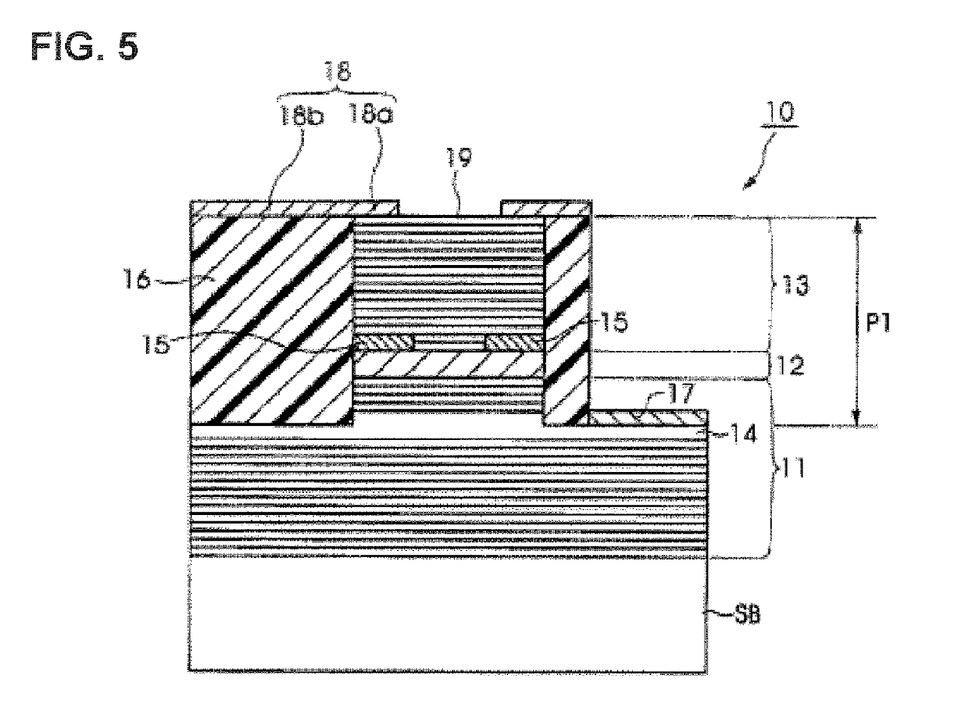
FIG. 5 is a cross-sectional view schematically showing a step of the method for manufacturing a surface-emitting type semiconductor laser in accordance with an embodiment of the invention.

When the steps described above are completed, an electrode 17 is formed on the upper surface of the first mirror 11 (on the thick film layer 14), and an electrode 18 is formed on the upper surface of the second mirror 13, as shown in FIG. 5. As described above, the electrode 18 includes a connecting section 18a having a ring-shaped plane configuration and a lead-out section 18b having a linear plane configuration. It is noted that the connecting section 18a is formed on the upper surface of the second mirror 13, and the lead-out section 18b is formed on the insulation layer 16.

In accordance with an exemplary method, the electrode 18 may be formed as follows. First, before the electrode 18 is formed, an upper surface of the second mirror 13 may be washed by a plasma processing method or the like, if necessary. As a result, an element with more stable characteristics can be formed. Next, a formed film (not shown) of platinum (Pt), titanium (Ti), and gold (Au), for example, is formed by, for example, a vacuum deposition method. Then, the electrode 18 is formed by removing the formed film other than specified positions by a lift-off method.

In this instance, a portion where the formed film is not formed is formed on the upper surface of the second mirror 13. This portion becomes an opening section, and a portion of the upper surface of the second mirror 13 is exposed through the opening section. The exposed surface defines an emission surface 19 of laser light. It is noted that a dry etching method or a wet etching method can be used in the above-described process instead of the lift-off method. Also, in the process described above, a sputter method can be used instead of the vacuum deposition method.

Next, by a similar method used in forming the electrode 18, a formed film of an alloy of gold (Au) and germanium (Ge), and gold (Au) is patterned, whereby an electrode 17 is formed on the first mirror 11 (on the thick film layer 14), as shown in FIG. 5. Finally, an annealing treatment is conducted. The temperature of the annealing treatment depends on the electrode material. This is usually conducted at about 400° C. for the electrode material used in the present embodiment. The electrodes 17 and 18 are formed by the process described above. By the process described above, the surface-emitting type semiconductor laser 10 shown in FIG. 1 in accordance with the present embodiment is manufactured.

As described above, in the surface-emitting type semiconductor laser 10 of the present embodiment, the thick film layer 14 is formed within the first mirror 11, and the columnar section P1 is formed by etching the second mirror 13, the active layer 12 and the first mirror 11 to an intermediate depth of the thick film layer 14 of the first mirror 11. Also, the GI layer L3 is formed between the thick film layer 14 composing the first mirror 11 and the higher composition layer L2 formed above the thick film layer 14, and the GI layers L3 are also formed between the lower composition layers L1 and the higher composition layers L2 composing the first mirror 11 located above the thick film layer 14. Furthermore, the GI layers are also formed between the lower composition layers and the higher composition layers forming the second mirror 13. For this reason, the resistance of the surface-emitting type semiconductor laser 10 can be lowered.

Also, the thick film layer 14 of the first mirror 11 is formed to be thicker than the other lower composition layers L1, and therefore the GI layer on the columnar section P1 can be sufficiently removed and the thick film layer 14 can be exposed even when the amount of etching varies at the time of forming the columnar section P1. Therefore, when the electrode 17 is formed on the thick film layer 14, good ohmic contact between the two can be obtained, and the adhesion of the electrode 17 can be increased. Accordingly, surface-emitting type semiconductor lasers can be manufactured with a high yield without exfoliation of electrodes occurring during the mounting process.

An embodiment of the invention is described above. However, the invention is not limited to the embodiment described above, and can be freely modified within the scope of the invention. For example, in the embodiment described above, the GI layer L3 is formed between the thick film layer 14 composing the first mirror 11 and the higher composition layer L2 formed above the thick film layer 14, and the GI layers L3 are also formed between the lower composition layers L1 and the higher composition layers L2 composing the first mirror 11 located above the thick film layer 14. Furthermore, the GI layers are also formed between the lower composition layers and the higher composition layers forming the second mirror 13. To reduce the resistance of the surface-emitting type semiconductor laser 10, all of the GI layers may preferably be formed. However, when the GI layers are formed, the refractive index of the first mirror 11 and the second mirror 13 may be lowered.

Accordingly, the GI layer L3 may be formed only between the thick film layer 14 composing the first mirror 11 and the higher composition layer L2 formed above the thick film layer 14; and the GI layers L3 between the lower composition layers L1 and the higher composition layers L2 composing the first mirror 11 located above the thick film layer 14, and the GI layers between the lower composition layers and the higher composition layers forming the second mirror 13 may be omitted.

Also, in the embodiment described above, the first mirror 11 and the second mirror 13 are formed with AlGaAs layers of mutually different Al compositions. However, the invention is not limited to AlGaAs layers, and it is also applicable to surface-emitting type semiconductor lasers in which a first mirror 11 and a second mirror 13 are formed with layers of other kinds of semiconductor. Moreover, in the embodiment described above, interchanging the p-type and n-type characteristics of each of the semiconductor layers does not deviate from the subject matter of the present invention.

Furthermore, the surface-emitting type semiconductor laser 10 in accordance with the embodiment described above has a structure in which the columnar section P1 is formed. However, the surface-emitting type semiconductor laser in accordance with the invention may not need to have such a structure. For example, the surface-emitting type semiconductor laser may be provided with a structure in which bores reaching from the second mirror 13 to the thick film layer 14 of the first mirror 11 (the bores may further reach an intermediate depth of the thick film layer 14) may be formed at several locations around the emission surface for emitting laser light. It is noted that the bores are used for forming a current constricting layer.

What is claimed is:

1. A surface-emitting type semiconductor laser comprising:
    an upper mirror and a lower mirror each composed of alternately formed first semiconductor layers and second semiconductor layers;
    an active layer disposed between the upper mirror and the lower mirror, wherein the surface-emitting laser emits laser light in a direction in which the first semiconductor layers and the second semiconductor layers are formed;
    a thick film layer formed with one of the first semiconductor layers composing the lower mirror, the thick film layer being thicker than other of the first semiconductor layers; and
    a third semiconductor layer provided between the thick film layer and one of the second semiconductor layers on the thick film layer, the third semiconductor layer having a refractive index between a refractive index of the first conductive layer and a refractive index of the second semiconductor layer;
    wherein the upper mirror, the active layer and a portion of the lower mirror above the thick film layer are formed into a columnar section in a columnar configuration; and
    wherein the thick film layer located at least below the columnar section has an optical film thickness of $3\lambda/4$ or greater and an odd multiple of $\lambda/4$, where $\lambda$ is a wavelength of the laser light.

2. A surface-emitting type semiconductor laser comprising:
    an upper mirror and a lower mirror each composed of alternately formed first semiconductor layers and second semiconductor layers;
    an active layer disposed between the upper mirror and the lower mirror, wherein the surface-emitting laser emits laser light in a direction in which the first semiconductor layers and the second semiconductor layers are formed;
    a thick film layer formed with one of the first semiconductor layers composing the lower mirror, the thick film layer being thicker than other of the first semiconductor layers; and
    a third semiconductor layer provided between the thick film layer and one of the second semiconductor layers on the thick film layer, the third semiconductor layer having a refractive index between a refractive index of the first conductive layer and a refractive index of the second semiconductor layer;
    wherein the thick film layer is the first semiconductor layer in one of first through fifth pairs of alternately formed first semiconductor layers and second semiconductor layers, the first pair being formed in an uppermost layer of the lower mirror.

3. A surface-emitting type semiconductor laser according to claim 2, wherein the third semiconductor layer is provided between at least one of pairs of alternately formed first semiconductor layers and second semiconductor layers located above the thick film layer.

4. A surface-emitting type semiconductor laser according to claim 2, wherein the second semiconductor layer is provided under the thick film layer without the third semiconductor layer being intervened.

5. A surface-emitting type semiconductor laser according to claim 4, wherein the first semiconductor layers and the second semiconductor layers located below the thick film layer are formed without the third semiconductor layers being intervened.

6. A surface-emitting type semiconductor laser according to claim 2, wherein the upper mirror, the active layer and a portion of the lower mirror above the thick film layer are formed into a columnar section in a columnar configuration.

7. A surface-emitting type semiconductor laser according to claim 6, wherein the thick film layer is formed into a columnar configuration having an upper portion with a plane configuration identical with a plane configuration of the columnar section.

8. A surface-emitting type semiconductor laser according to claim 6, wherein one of electrodes that supply a current to the active layer is formed on the thick film layer.

9. A surface-emitting type semiconductor laser according to claim 2, wherein the first semiconductor layer and the second semiconductor layer are composed of mixed crystal semiconductors of mutually different compositions.

10. A surface-emitting type semiconductor laser according to claim 9, wherein the first semiconductor layer is composed of mixed crystal semiconductor of a lower composition compared to the second semiconductor layer.

* * * * *